United States Patent
Jiang et al.

(10) Patent No.: US 6,323,074 B1
(45) Date of Patent: Nov. 27, 2001

(54) HIGH VOLTAGE ESD PROTECTION DEVICE WITH VERY LOW SNAPBACK VOLTAGE BY ADDING AS A P+ DIFFUSION AND N-WELL TO THE NMOS DRAIN

(75) Inventors: Jyh-Min Jiang; Kuo-Chio Liu; Jian-Hsing Lee; Ruey-Hsin Liu, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/557,394

(22) Filed: Apr. 24, 2000

(51) Int. Cl.⁷ ............................................. H01L 21/8238
(52) U.S. Cl. ........................................ 438/202; 438/201
(58) Field of Search ................................ 438/202, 199, 438/200, 201, 134, 135; 257/360–362, 173

(56) References Cited

U.S. PATENT DOCUMENTS

| | | | |
|---|---|---|---|
| 5,455,436 | 10/1995 | Cheng | 257/356 |
| 5,541,801 | 7/1996 | Lee et al. | 361/56 |
| 5,869,873 * | 2/1999 | Yu | 257/362 |
| 5,894,153 | 4/1999 | Walker et al. | 257/355 |
| 5,959,820 | 9/1999 | Ker et al. | 361/111 |
| 6,066,879 * | 5/2000 | Lee et al. | 257/355 |

* cited by examiner

Primary Examiner—David Nelms
Assistant Examiner—Dung A Le
(74) Attorney, Agent, or Firm—George O. Saile; Stephen B. Ackerman

(57) ABSTRACT

A device layout is disclosed for an ESD device for protecting NMOS high voltage transistors where the SCR protection device and the two NMOS transistors are integrated. The two NMOS transistors share an n-type doped drain (ndd) area which has implanted two n+ drains, one for each of the two transistors and a p+ diffusion separates the two n+ drains. Furthermore, the ndd area has implanted an n-well which extends from halfway under the first n+ drain to halfway under the second n+ drain. In addition, the depth of the n-well exceeds the depth of the ndd area. The added p+diffusion together with the ndd area and the p-substrate of the silicon wafer create the parasitic pnp transistors of the SCR. The shared ndd area together with the n+ sources of the NMOS transistors creates the SCR's two parasitic npn transistors. The low triggering voltage of the SCR is achieved by the combination of the n-well, the ndd area, the p+diffusion between the two drains, and by having the two parasitic npn transistors paralleled.

5 Claims, 4 Drawing Sheets

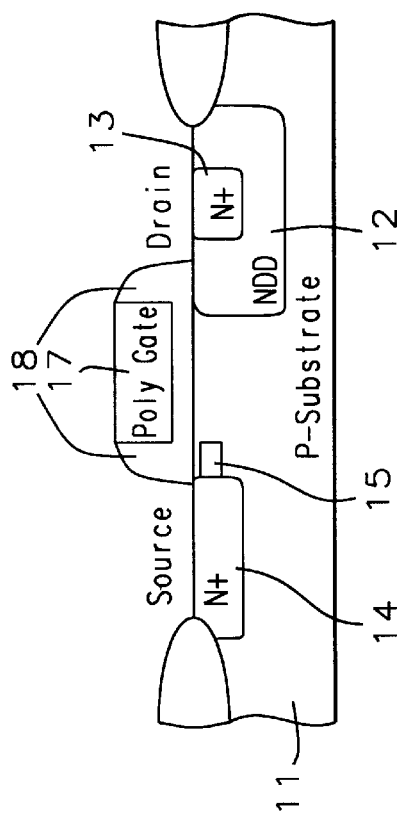
FIG. 1 – Prior Art
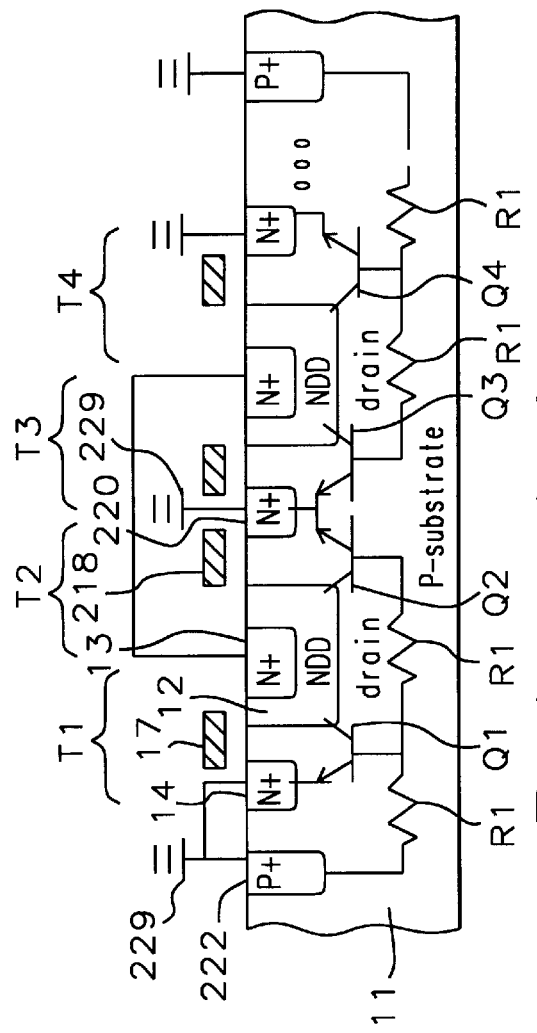
FIG. 2 – Prior Art

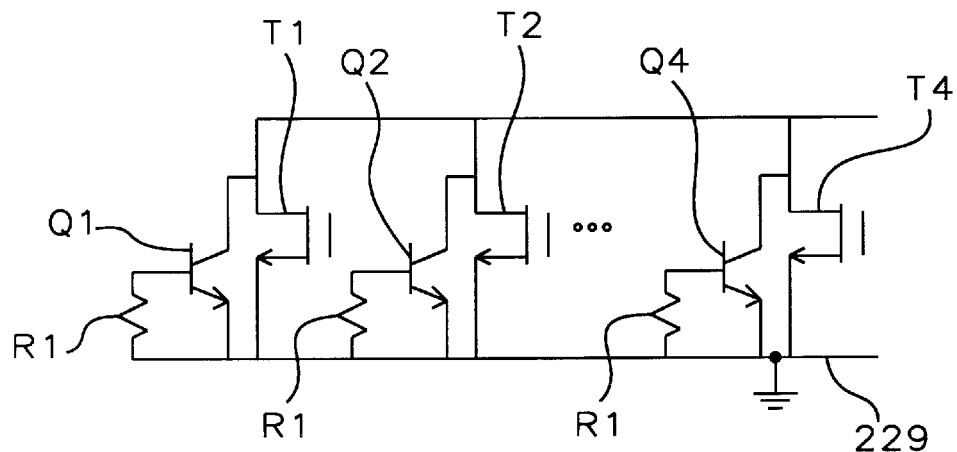
FIG. 3 – Prior Art
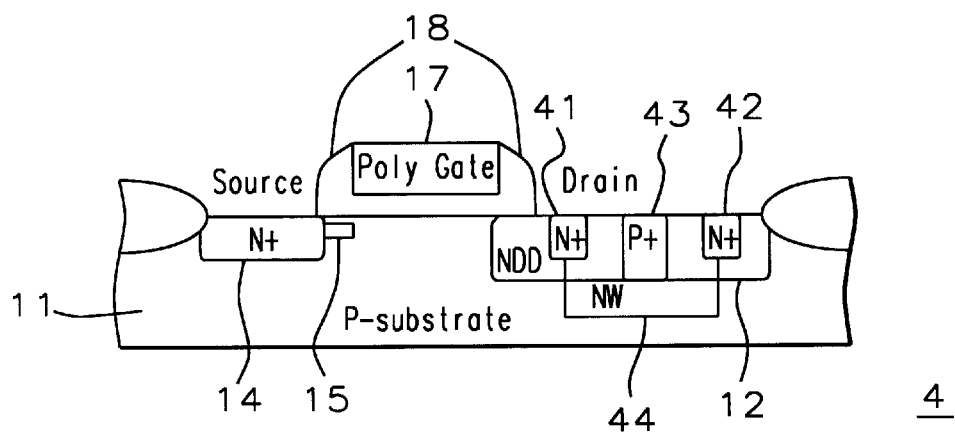
FIG. 4

HIGH VOLTAGE ESD PROTECTION DEVICE WITH VERY LOW SNAPBACK VOLTAGE BY ADDING AS A P+ DIFFUSION AND N-WELL TO THE NMOS DRAIN

BACKGROUND OF THE INVENTION

1. Field of the Invention

The invention relates to the protection of integrated circuits from electrostatic discharge (ESD), and more particularly to the protection of high voltage NMOS transistors by a parasitic silicon controlled rectifier (SCR) which triggers at a very low voltage.

2. Description of the Related Art

The protection of integrated circuits from electrostatic discharge (ESD) is a subject which has received a lot of attention from circuit designers because of the serious damage that ESD can wreak as device dimensions are reduced. Workers in the field and inventors have proposed many solutions, many trying to solve the problem of protecting sub-micron devices while still allowing them to function unencumbered and without undue, or zero, increase of silicon real estate. The main thrust of ESD protection for MOS devices is focused on the use of parasitic npn and pnp bipolar transistors, which together form a silicon controlled rectifier (SCR). Unwanted as this SCR normally is, it can safely discharge dangerous ESD voltages as long as its trigger voltage is low enough to protect those MOS devices of which it is a part.

FIG. 1 is a schematic cross-section of a high voltage n-channel metal oxide semiconductor (NMOS) device structure of the prior art showing a p-substrate 11, an n-type doped drain (ndd) area 12 with an n+ drain 13, and an n+ source 14 with a lightly doped drain (ldd) implant 15. A polysilicon gate 17 with sidewall spacers 18 on either side covers the space between the drain 13 and the source 14.

FIG. 2 is a cross section of an implementation of the same structure as shown in FIG. 1, showing four n-channel transistors T1 to T4 in a p-substrate 11. Transistor T1 is comprised of n+ source 14, gate 17, ndd area 12 with an n+ drain 13 diffused into it. Transistor T2 is comprised of the same ndd area 12 with n+ drain 13, gate 218, and n+ source 220, which is connected to ground. A p+ region 222 is implanted adjacent to n+ source 14 and both are connected to ground 229. As is evident from FIG. 2, transistors T3 and T4 are mirror images of transistors T1 and T2. This arrangement can be repeated as many times as necessary and depends on the current capacity desired. Note parasitic bipolar npn transistors Q1 and Q2, their emitters, bases, and collectors formed by n+ sources 14 and 220, p-substrate 11 and ndd area 12, respectively. Their bases are connected to p+ region 222 via parasitic resistors R1, where these resistors symbolize the intrinsic resistance of p-substrate 11. Transistors T3 and T4 along with parasitic npn bipolar transistors Q3 and Q4 form a mirror image to the arrangement comprised of transistors T1, T2, Q1, and Q2.

FIG. 3 is the equivalent-circuit diagram of FIG. 2. It is apparent that the n-channel transistors T1 to T4 and parasitic npn transistor Q1 to Q4 are paralleled and that their bases are tied to ground via resistors R1. This explains why the electrostatic discharge (ESD) failure threshold voltage of the high voltage NMOS devices is very low, because its snapback voltage is very high, sometimes as high as 10 Volt or more. Despite the high and unstable snapback voltage power damage still occurs.

Other related art is described in the following U.S. Patents which propose low voltage lateral SCRs (LVTSCR), modified lateral SCRs (MLSCR), PMOS-trigger lateral SCRs (PTLSCR), NMOS-trigger lateral SCRs (NTLSCR), and modified PTLSCRs and NTLSCRs to control electrostatic discharge:

U.S. Pat. No. 5,959,820 (Ker et al.) proposes two or more cascoded low voltage triggering SCRs (LVTSCR) which are cascoded in series by coupling control gates in common and with an anode and a cathode of an LVTSCR coupled between the power supplies. Other devices utilized are and NMOS-controlled lateral SCRs (NCLSCR) and PMOS-controlled lateral SCRs (PCLSCR)

U.S. Pat. No. 5,894,153 (Walker et al.) describes an integrated circuit with a pad which is protected by an SCR which conducts ESD pulses from the pad to a current sink. The SCR includes a subregion underneath a field oxide that has a field implant that increases the dopant concentration. The field implant lowers the SCR trigger voltage, so that the SCR triggers before an ESD pulse can cause latchup damage.

U.S. Pat. No. 5,541,801 (Lee et al.) uses three LVTSCRs which are connected between $V_{dd}$, the circuit to be protected, and $V_{ss}$. Each of the SCRs uses a PMOS/NMOS transistor to lower the trigger voltage. The gates of the PMOS/NMOS transistors are each in turn connected via linked terminals of trigger gates to the circuit to be protected.

U.S. Pat. No. 5,455,436 (Cheng) teaches the use of a non-LDD NMOS junction which forms the equivalent npn transistor of the protective SCR structure. The abrupt drain junction produces a lower avalanche breakdown voltage than the LDD junction and triggers the SCR during an ESD pulse.

It should be noted that none of the above-cited examples of the related art utilize a p+ diffusion and an n-well to the high voltage NMOS drain side to provide a snap-back voltage of less than 2 Volt, a high Human Body Model (HBM) ESD Passing Voltage of up to 8 kVolt, as is proposed subsequently.

SUMMARY OF THE INVENTION

It is an object of the present invention to provide an ESD device for protecting NMOS transistors, where the SCR of that ESD device has a snapback voltage of less than 2 Volt and where the NMOS transistors and the SCR are integrated.

Another object of the present invention is to reduce the size of the silicon real estate for the combination of NMOS and SCR.

A further object of the present invention is to provide a HBM ESD Passing Voltage of 8,000 Volt.

These objects have been achieved by providing two n-channel transistors which share an n-type doped drain (ndd) area. The ndd area has implanted two n+ drains (one for each of the two transistors) and a p+ diffusion separates the two n+ drains. Furthermore, the ndd area has implanted an n-well which extends from halfway under the first n+ drain to halfway under the second n+ drain. In addition, the depth of the n-well exceeds the depth of the ndd area. The p+ diffusion and the n-well together form the emitter and base of a parasitic pnp bipolar transistor, respectively. The p-substrate of the semiconductor wafer forms the collector of the pnp transistor. The n-well also forms the collector of two parasitic npn bipolar transistors, while the p-substrate forms the bases. The n+ sources of the two n-channel transistors form the emitters. The pnp transistor and the two npn transistors create the aforementioned (parasitic) SCR.

The low triggering voltage of the SCR is achieved by having the parasitic npn transistors of the SCR in parallel with one of the NMOS transistors by sharing the n-well (collector/drain), p-substrate (base/channel region), and an adjacent n+ diffusion (emitter/source) in the p-substrate, as already detailed above. The high HBM ESD Passing Voltage is made possible by having the n-well straddle the n+ drains of the NMOS transistors and by the combination of the ndd area and the n-well.

BRIEF DESCRIPTION OF THE DRAWINGS

FIG. 1 is a schematic cross-sectional view of a high voltage NMOS device structure of the prior art.

FIG. 2 is a detailed cross-sectional view of a typical implementation of the high voltage NMOS device structure of FIG. 1.

FIG. 3 is an equivalent-circuit diagram of FIG. 2.

FIG. 4 is a schematic cross-sectional view of a high voltage NMOS device structure of the preferred embodiment of the present invention.

DESCRIPTION OF THE PREFERRED EMBODIMENT

Figure 5:
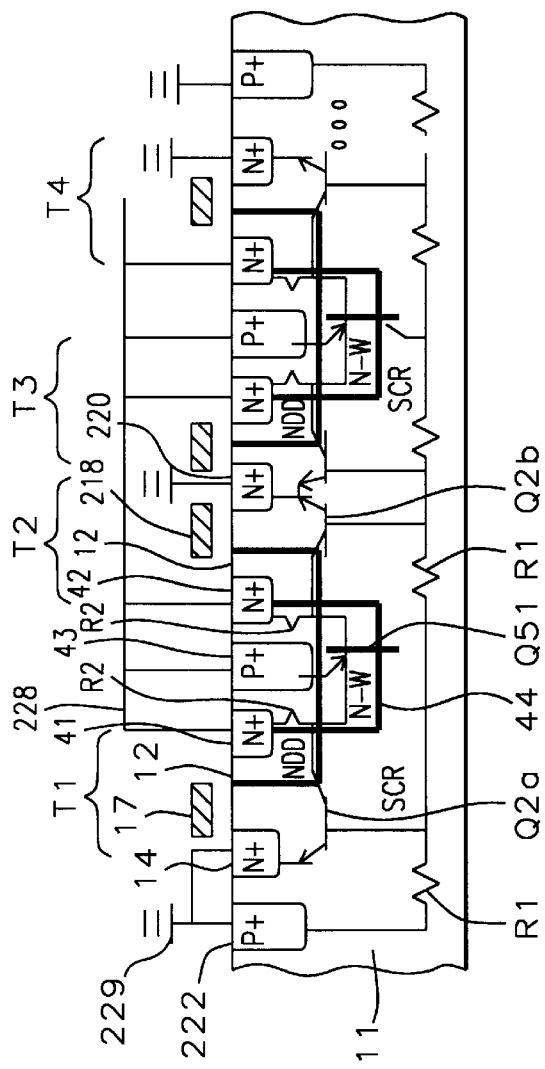
FIG. 5 is a detailed cross-sectional view of a typical implementation of the high voltage NMOS device structure of FIG. 4.

We now describe the preferred embodiment of an integrated circuit and a method of fabrication of an electrostatic discharge (ESD) device which is part of high voltage n-channel metal oxide semiconductor (NMOS) transistors and where the ESD device, in the form of a parasitic SCR, is integrated with these n-channel MOS transistors.

Referring now to FIG. 4, we show the preferred embodiment of the transistor structure of present invention. Note that the same numerals in the Figures designate the same component. FIG. 4 is a cross-sectional view of a semiconductor wafer 4 with a p-substrate 11 in which is placed a high voltage n-channel MOS transistor having an n+ source 14 and a lightly doped drain (ldd) 15 diffused into p-substrate 11, an n-type doped drain (ndd) area 12, and a polysilicon gate 17 with sidewall spacers 18, where polysilicon gate 17 is disposed above the space separating n+ source 14 and ndd area 12. Implanted in ndd area 12 are first and second n+ drains 41, 42 and between them is implanted a p+ diffusion 43, separated by spaces from n+ drains 41 and 42. An n-well 44 is implanted in ndd area 12, where n-well 44 extends from halfway under first n+ drain 41 to halfway under second n+ drain 42. N-well 44, in addition, extends below the depth of ndd area 12. P+ diffusion 43, n-well 44, and p-substrate 11 form the emitter, base, and collector of a parasitic pnp transistor, respectively, which will be discussed later in greater detail. The depth of p+ diffusion 43 extends to the depth of ndd area 12, whereas the depth of first and second n+ drain 41 and 42 is less than the depth of ndd area 12.

We next refer to FIG. 5, which depicts a high voltage electrostatic discharge (ESD) protection device composed of transistors T1 to T4 which utilize the preferred embodiment of the present invention of a modified drain of an n-channel metal oxide semiconductor (NMOS) transistor, as illustrated in FIG. 4. A second identical ESD protection device, comprised of transistors T3 and T4, is shown adjacent and in a mirror image to the first ESD protection device which encompasses transistors T1 and T2. Referring again to FIG. 5, we show a semiconductor wafer 5 with a p-substrate 11, the first n-channel transistor T1 with a first n+ source 14, an n-type doped drain (ndd) area 12, and a first polysilicon gate 17. First polysilicon gate 17 is disposed above the space separating first n+ source 14 and ndd area 12. ndd area 12 further comprises first and second n+ drains 41 and 42, a first p+ diffusion 43 implanted between first and second n+ drains 41 and 42. P+ diffusion 43 is separated by spaces from first and second n+ drain 41 and 42. N-well 44 is implanted in ndd area 12 and extends from halfway under first n+ drain 41 to halfway under second n+ drain 42. In addition, n-well 44 extends below the depth of ndd area 12.

A second p+ diffusion 222 is implanted adjacent to first n+ source 14, where both are connected to a reference voltage 229. A second n-channel transistor T2 is deposited comprising second n+ drain 42, a second polysilicon gate 218, and a second n+ source 220. The second n+ source 220 is implanted in p-substrate 11 adjacent to ndd area 12 and is connected to reference voltage 229. The second polysilicon gate 218 is disposed above the space separating ndd area 12 and second n+ source 220. Conductive means 228 connect first n+ drain 41, second n+ drain 42, and first p+ diffusion 43. The various implants together with p-substrate 11 form a parasitic silicon controlled rectifier (SCR), which comprises:

a parasitic pnp bipolar transistor Q51 and first and second parasitic npn bipolar transistors Q2a and Q2b. The emitter, base, and collector of parasitic pnp bipolar transistor Q51 are formed by first p+ diffusion 43, n-well 44, and p-substrate 11, respectively. The emitter, base, and collector of first parasitic npn bipolar transistor Q2a are formed by first n+ source 14, p-substrate 11, and ndd area 12, respectively. The emitter, base, and collector of second parasitic npn bipolar transistor Q2b are formed by second n+ source 220, p-substrate 11, and ndd area 12, respectively. Transistors Q2a and Q2b are in parallel as will become obvious when the equivalent circuit of FIG. 5 is explained. The bases of first and second parasitic npn bipolar transistors Q2a and Q2b are connected to second p+ diffusion 222 via the parasitic resistance R1 of p-substrate 11. The collector of first parasitic npn bipolar transistor Q2a is connected to first n+ drain 41 via the parasitic resistance R2 of ndd area 12. Similarly, the collector of second parasitic npn bipolar transistor Q2b is connected to second n+ drain 42 via the parasitic resistance R2 of ndd area 12. Like first n+ source 14, second n+ source 220 is also connected to reference voltage 229.

Regarding parasitic pnp bipolar transistor Q51, its base is connected to first and said second n+ drains 41 and 42 via the same parasitic resistance R2 of ndd area 12, and its collector is connected to second p+ diffusion 222 via the parasitic resistance R1 of p-substrate 11. Parasitic transistors Q2a, Q2b, and Q51, along with resistors R1 and R2 comprise a parasitic SCR which has a snapback voltage of less than 2 volt and protects integrated circuits from electrostatic discharge voltages of up to 8 kVolt. The described arrangement of n-channel MOS transistors T1 and T2 along with the parasitic SCR constitute an ESD protection device. A plurality of copies of the above described ESD protection device can be deposited adjacent to it as shown in FIG. 5 as transistors T3 and T4 along with a corresponding parasitic SCR, thereby paralleling these ESD protection devices and increasing the ESD current handling capabilities.

Figure 6:
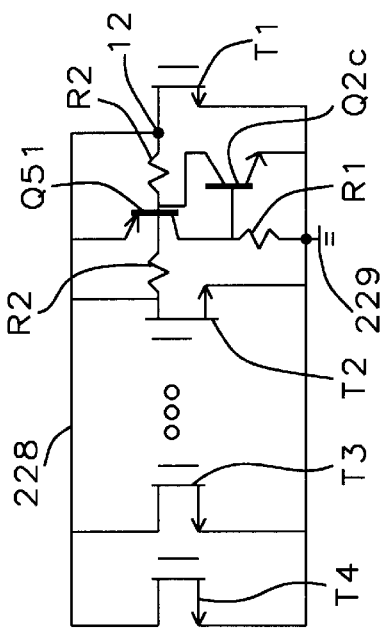
FIG. 6 is an equivalent-circuit diagram of FIG. 5.

Turning to FIG. 6, we now describe the equivalent-circuit diagram of FIG. 5. N-channel transistors T1, T2, T3, and T4 are shown connected between voltage rail 228 and reference voltage or ground 229. Parasitic bipolar transistors Q51 and Q2c, along with parasitic resistors R1 and R2 make up the parasitic SCR. Transistors Q2a and Q2b of FIG. 5 are merged into transistor Q2c for the sake of clarity of the equivalent-circuit diagram. The same applies to resistors R1 and R2 where only one of each is shown. The parasitic SCR for transistors T3 and T4 is not shown—again for reasons of clarity—but it is understood that they have a similar SCR from inspection of FIG. 5.

It is worth noting that the emitter of transistor Q51 of this parasitic SCR, the basis of protecting NMOS transistors T1 and T2 from electrostatic discharge, is created by adding p+ diffusion 43 between n+ drains 41 and 42. The addition of this p+ diffusion does not increase much ndd area 12 nor n-well 44, although in FIG. 5 it is shown as being larger than ndd area 12 of the prior art, see FIG. 2. The overall area actually is less for the present invention when compared to the prior art, because no separate SCR is needed.

In an ESD event the protection of the NMOS transistors by the SCR is achieved by the following mechanism (refer to FIG. 6):

as the voltage goes up, first ndd area 12 (drain of T1) breaks down and turns on npn transistor Q2c;

current flows into ndd area 12 and turns on pnp transistor Q51;

the SCR fires and conducts the current of the electrostatic discharge from voltage supply 228 to reference potential 229 (typically ground).

Experiments conducted with the circuit of the invention are tabulated in Table 1. They indicate a reduction of the snapback voltage from 10 Volt or more for the prior art to a typical snapback voltage for the NMOS with SCR of the invention to less than 2 Volt. Depending on device parameter variations and other factors this voltage may range from 1 to 2 Volt. Table 1 also shows that the Human Body Model (HBM) ESD Passing Voltage increased from 2 kV for the device of the prior art to 8 kV for the invention.

TABLE 1

|  | snapback voltage | HBM ESD Passing Voltage |
|---|---|---|
| circuit of FIG. 2, prior art | 10 V or larger | 2 kV |
| circuit of FIG. 5, the invention | less than 2 V | 8 kV |

Figure 7:
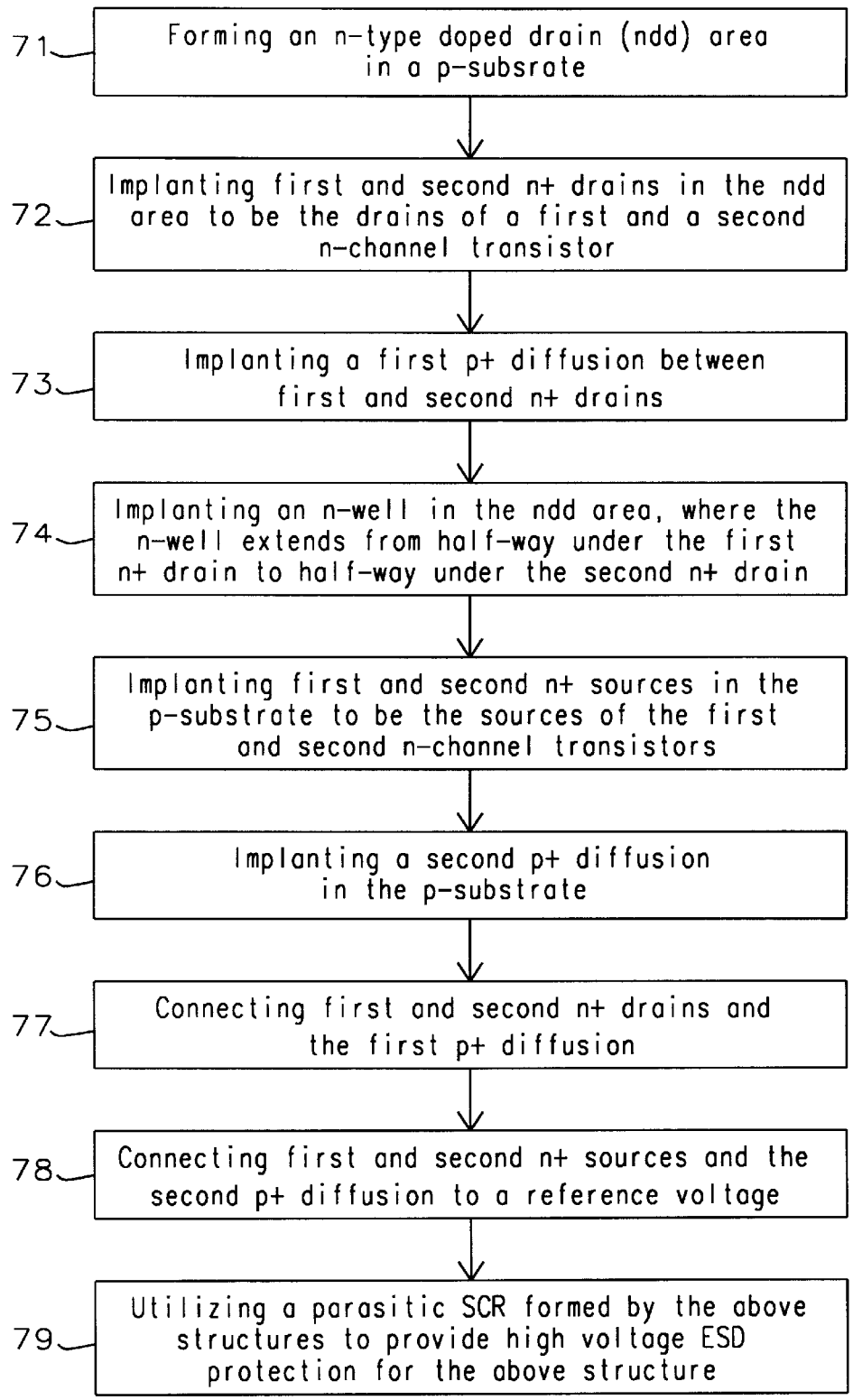
FIG. 7 is a block diagram of the method of the invention.

We now discuss the method of this invention by reference to FIG. 7.

Block 71 describes forming an n-type doped drain (ndd) area in a p-substrate.

In BLOCK 72 occurs implanting of first and second n+ drains in the ndd area to be the drains of a first and a second n-channel transistor.

Implanting a p+ diffusion between first and second n+ drains is done in BLOCK 73.

A crucial step follows with the implanting of an n-well in the ndd area, where the n-well extends from halfway under the first n+ drain to halfway under the second n+ drain, see BLOCK 74.

Implanting of first and second n+ sources in the p-substrate to be the sources of the first and second n-channel transistors follows in BLOCK 75.

A second p+ diffusion is next implanted in the p-substrate per BLOCK 76.

In BLOCK 77 follows connecting of first and second n+ drains and the first p+ diffusion.

Next, in BLOCK 78, are connected first and second n+ sources and the second p+ diffusion to a reference voltage (typically ground potential).

In BLOCK 79 high voltage ESD protection for the above structure is afforded by the method of utilizing a parasitic SCR formed by the above structures.

The parasitic SCR of BLOCK 79 comprises a parasitic pnp transistor formed by the first p+ diffusion (emitter), the n-well (base), and the p-substrate (collector) and two parasitic npn transistors which are essentially connected in parallel. The first npn transistor is formed by the first n+ source (emitter), the ndd area (base), and the p-substrate (collector). The second npn transistor is very similar, being formed by the second n+ source (emitter), the ndd area (base), and the p-substrate (collector).

The preferred embodiment of the present invention has the advantage of utilizing less real estate by adding a p+ diffusion to the ndd area of the NMOS transistor and, thus, integrating one transistor of the protection device (SCR). The other advantage is that by paralleling, at the device level, NMOS and parasitic npn bipolar transistors, the SCR triggers at below 2 Volt. Thirdly, the invention affords ESD protection of up to 8000 Volt.

While the invention has been particularly shown and described with reference to the preferred embodiments thereof, it will be understood by those skilled in the art that various changes in form and details may be made without departing from the spirit and scope of the invention.

What is claimed is:

1. A method of constructing a high voltage electrostatic discharge (ESD) protection device using a modified drain of an n-channel metal oxide semiconductor (NMOS), comprising the steps of:

providing a semiconductor wafer with a p-substrate;

providing a first n-channel transistor with a first n+ source, an n-type doped drain (ndd) area, and a first polysilicon gate;

starting said ndd area where said polysilicon gate ends;

implanting first and second n+ drains in said ndd area;

implanting a first p+ diffusion between said first and said second n+ drain, said p+ diffusion separated by spaces from said first and said second n+ drain;

implanting an n-well in said ndd area, said n-well extending from under said first n+ drain to under said second n+ drain, said n-well extending, in addition, below the depth of said ndd area;

implanting a second p+ diffusion adjacent to said first n+ source;

connecting said second p+ diffusion and said first n+ source to a reference voltage;

forming a second n-channel transistor comprised of a second n+ source, a second polysilicon gate and said second n+ drain by implanting said second n+ source in said p-substrate and disposing said second polysilicon gate between said second n+ source and where said ndd area ends;

connecting by conductive means said first, said second n+ drain, and said first p+ diffusion;

protecting said first and said second n-channel transistor by utilizing an intrinsic parasitic silicon controlled rectifier (SCR) as said ESD protection device, said SCR further comprised of:

a parasitic pnp bipolar transistor formed by said first p+ diffusion, said n-well, and said p-substrate; and a parasitic npn bipolar transistor formed by said second n+ source, said p-substrate, and said ndd area.

2. The method of claim 1, wherein the emitter of said parasitic pnp bipolar transistor is said first p+ diffusion.

3. The method of claim 1, wherein said SCR has a snapback voltage of less than 2 Volt.

4. The method of claim 1, wherein said SCR protects from electrostatic discharge voltages up to 8 kVolt.

5. The method of claim 1, wherein a plurality of copies of said ESD protection device are deposited adjacent to said ESD protection device, thereby paralleling said ESD protection devices.

* * * * *

UNITED STATES PATENT AND TRADEMARK OFFICE
CERTIFICATE OF CORRECTION

PATENT NO.    : 6,323,074 B1
DATED         : November 27, 2001
INVENTOR(S)   : Jyh-Min Jiang, Kuo-Chio Liu, Jian-Hsing Lee, Ruey-Hsin Liu It is certified that error appears in the above-identified patent and that said Letters Patent is hereby corrected as shown below:

<u>Title page,</u>
Item [54], the title should read -- A NOVEL HIGH VOLTAGE ESD PROTECTION DEVICE WITH VERY LOW SNAPBACK VOLTAGE BY ADDING A P+ DIFFUSION AND N-WELL TO THE NMOS DRAIN --.

Signed and Sealed this

Ninth Day of April, 2002

*Attest:*

*Attesting Officer*

JAMES E. ROGAN
*Director of the United States Patent and Trademark Office*